(12) United States Patent
Ye et al.

(10) Patent No.: US 12,525,521 B2
(45) Date of Patent: Jan. 13, 2026

(54) PACKAGE SUBSTRATE FOR A SEMICONDUCTOR DEVICE

(71) Applicant: Micron Technology, Inc., Boise, ID (US)

(72) Inventors: Seng Kim Ye, Singapore (SG); Kelvin Tan Aik Boo, Singapore (SG); Hong Wan Ng, Singapore (SG); Chin Hui Chong, Singapore (SG)

(73) Assignee: Micron Technology, Inc., Boise, ID (US)

( * ) Notice: Subject to any disclaimer, the term of this patent is extended or adjusted under 35 U.S.C. 154(b) by 670 days.

(21) Appl. No.: 17/897,155

(22) Filed: Aug. 27, 2022

(65) Prior Publication Data

US 2024/0071880 A1 Feb. 29, 2024

(51) Int. Cl.
 H01L 23/498 (2006.01)
 H01L 21/48 (2006.01)
 H01L 21/56 (2006.01)
 H01L 25/065 (2023.01)
 H01L 25/16 (2023.01)
 H01L 23/00 (2006.01)

(52) U.S. Cl.
 CPC .... *H01L 23/49816* (2013.01); *H01L 21/4853* (2013.01); *H01L 21/563* (2013.01); *H01L 23/49833* (2013.01); *H01L 23/49838* (2013.01); *H01L 25/0657* (2013.01); *H01L 25/16* (2013.01); *H01L 23/49822* (2013.01); *H01L 24/16* (2013.01); *H01L 24/48* (2013.01); *H01L 24/97* (2013.01); *H01L 2224/16145* (2013.01); *H01L 2224/16225* (2013.01); *H01L 2224/48147* (2013.01); *H01L 2224/48225* (2013.01); *H01L 2225/06513* (2013.01); *H01L 2225/06517* (2013.01); *H01L 2225/0652* (2013.01); *H01L 2225/06524* (2013.01); *H01L 2924/1431* (2013.01); *H01L 2924/1438* (2013.01); *H01L 2924/19041* (2013.01)

(58) Field of Classification Search
 None
 See application file for complete search history.

(56) References Cited

U.S. PATENT DOCUMENTS 10,629,508 B2 * 4/2020 Yu ........................... H01L 24/96
2019/0287584 A1 * 9/2019 Hollis .................. G11C 7/1096
(Continued)

*Primary Examiner* — Cory W Eskridge
(74) *Attorney, Agent, or Firm* — Dorsey & Whitney LLP

(57) ABSTRACT

This document discloses techniques, apparatuses, and systems relating to a package substrate for a semiconductor device. A semiconductor device assembly is described that includes a packaged semiconductor device having one or more semiconductor dies coupled to a package-level substrate. The package-level substrate has a first surface at which first contact pads are disposed in a first configuration. The packaged semiconductor device is coupled with an additional package-level substrate that includes a second surface having second contact pads disposed in the first configuration and a third surface having third contact pads disposed in a second configuration different from the first configuration. The additional package-level substrate includes circuitry coupling the second contact pads the third contact pads to provide connectivity at the third contact pads. In doing so, an adaptively compatible semiconductor device may be assembled.

20 Claims, 14 Drawing Sheets

(56) References Cited

U.S. PATENT DOCUMENTS

2020/0020624 A1\* 1/2020 Kang ................ H01L 23/49833
2021/0050292 A1\* 2/2021 Kim ................. H01L 23/49838
2021/0175161 A1\* 6/2021 Park ....................... H01L 24/06
2023/0005872 A1\* 1/2023 Kim ....................... H01L 24/29

\* cited by examiner

PACKAGE SUBSTRATE FOR A SEMICONDUCTOR DEVICE

TECHNICAL FIELD

The present disclosure generally relates to semiconductor device assemblies, and more particularly relates to through-substrate connections for recessed semiconductor dies.

BACKGROUND

Microelectronic devices generally have a die (i.e., a chip) that includes integrated circuitry with a high density of very small components. Typically, dies include an array of very small bond pads electrically coupled to the integrated circuitry. The bond pads are external electrical contacts through which the supply voltage, signals, etc., are transmitted to and from the integrated circuitry. After dies are formed, they are "packaged" to couple the bond pads to a larger array of electrical terminals that can be more easily coupled to the various power supply lines, signal lines, and ground lines. Conventional processes for packaging dies include electrically coupling the bond pads on the dies to an array of leads, ball pads, or other types of electrical terminals, and encapsulating the dies to protect them from environmental factors (e.g., moisture, particulates, static electricity, and physical impact).

DETAILED DESCRIPTION

Semiconductor devices are integrated in many devices to implement memory cells, processor circuits, imager devices, and other functional features. As more applications for semiconductor devices are discovered, designers are tasked with creating improved devices that can perform a greater number of operations per second, store greater amounts of data, or operate with a higher level of security. To accomplish this task, designers continue to develop new techniques to increase the number of circuit elements on a semiconductor device without simultaneously increasing the size of the device. This development, however, may not be sustainable due to various challenges that arise from designing semiconductor devices with high circuit density. Thus, additional techniques may be required to continue the growth in capability of semiconductor devices.

One such technique is to implement multiple circuit components within a single package. These multiple circuit components may be efficiently arranged within the package to provide a compact semiconductor device capable of various functionality. While packaged semiconductor devices may enable complex arrangements of circuit components within the package, the external connections of the packaged device may be required to be compatible with other devices, for example, other devices implemented in a same host device. To provide this device compatibility, the various circuit components may be coupled to a package-level substrate with external connections that are compatible with a component (e.g. motherboard) of the host device. In some cases, customers may request semiconductor devices with the same functional requirements, albeit different compatibility requirements. Due to integration of the package-level substrate within the packaged semiconductor device, however, semiconductor device manufacturers may be forced to design a new package substrate, and thus a new packaged semiconductor device, to satisfy each customers compatibility requirements, even when the functionality of the packaged semiconductor device is identical across customers. Thus, many solutions for manufacturing packaged semiconductor devices may create inefficiencies in the manufacturing process that may reduce throughput and cross-compatibility of device designs. One such semiconductor device assembly is illustrated by way of example in FIG. 1.

Figure 1:
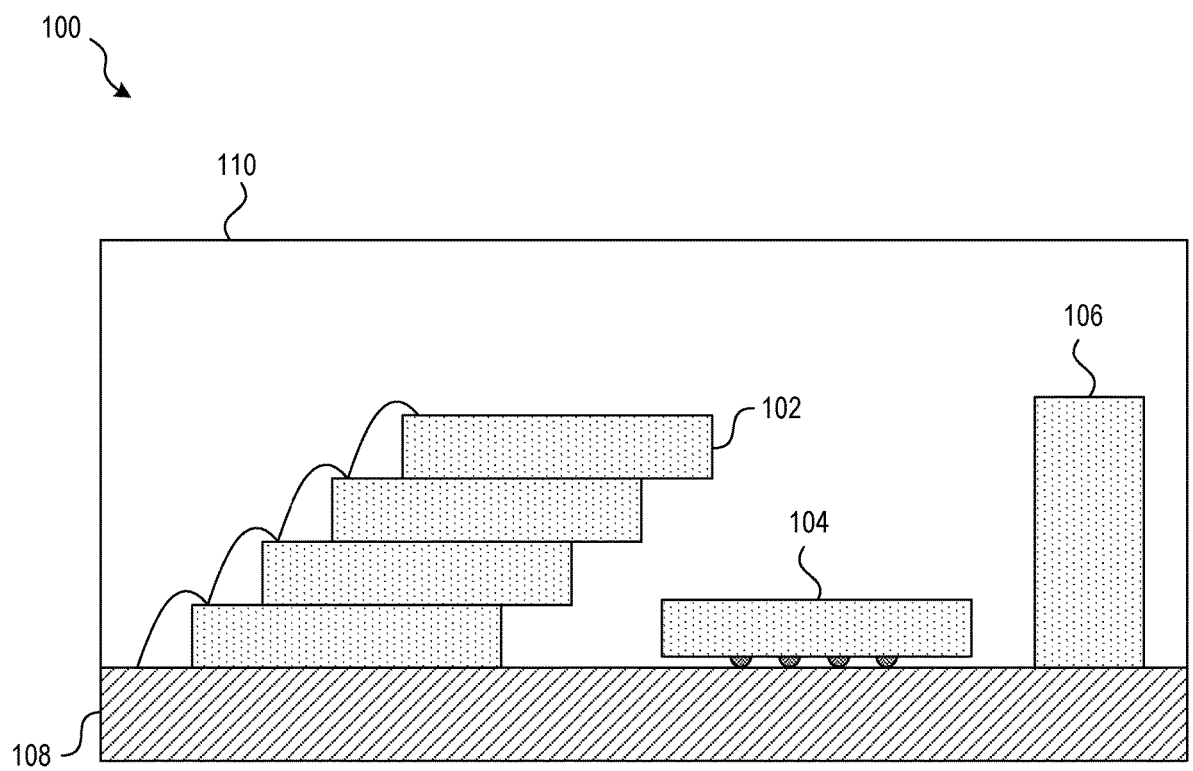
FIG. 1 illustrates a simplified schematic cross-sectional view of an example semiconductor device assembly.

As can be seen with reference to FIG. 1, a semiconductor device assembly 100 includes multiple circuit components implemented within a memory device. The multiple circuit components include memory dies 102, a logic die 104, and a capacitor 106 implemented at a package-level substrate 108. The multiple circuit components may couple to contacts at the upper surface of the package-level substrate 108. For example, the memory dies 102 may couple to contacts at the package-level substrate 108 using conductive wires that connect to pins at the memory dies 102. The logic die 104 may connect to the package-level substrate 108 through contact pads at a lower surface of the logic die 104 and contact pads at the upper surface of the package-level substrate 108. The capacitor 106 may couple with contacts at the upper surface of the package-level substrate 108. The multiple circuit components and the package-level substrate 108 may be at least partially encapsulated by an encapsulant 110 to protect the circuit components from interferences (e.g., moisture, particulates, static electricity, and physical impact).

Any of the multiple circuit components may couple with one another directly or through the package-level substrate 108 to provide various functionality to the semiconductor device. The package-level substrate 108 may additionally include circuitry that couples the multiple circuit components to additional circuit components to provide external connectivity to the semiconductor device (e.g., power, ground, input/output (I/O) signals, etc.). For example, the package-level substrate 108 may include circuitry (e.g., traces, lines, vias, etc.) that couples contacts at the upper surface to contact pads at the lower surface. The semiconductor device may then connect to additional components implemented at the host device to provide various functionality. For instance, the capacitor 106 may connect to an external power source to regulate power to the memory dies 102 or to the logic die 104, and the logic die 104 may control operations of the memory dies 102 to store or retrieve data for a processor coupled to the package-level substrate 108. In this way, the semiconductor device may provide functionality to a compatible host device.

The semiconductor device may be designed with a particular compatibility, for example, a same compatibility as a host device in which the semiconductor device is implemented. In general, the host device may include a printed circuit board (PCB) at which multiple components of the host device are implemented. The PCB may include contact pads arranged in a particular configuration and compatible with devices having external connections arranged in a same configuration. To make the packaged semiconductor device compatible with the PCB, the package-level substrate 108 may be designed to have externally exposed contact pads configured similarly to the contact pads on the PCB. As a result, however, the packaged semiconductor device may not be compatible with a different host device, for example, a PCB used by a different customer. Once packaged, the circuit components may be fixed to the package-level substrate 108. Thus, to implement a semiconductor device having the same functionality (e.g., a memory device having the same functional specifications) but with a different compatibility, an entirely new semiconductor device may need to be manufactured. Therefore, some packaging solutions may create design inefficiencies and inhibit the compatibility of devices across customers.

To overcome these deficiencies and others, the technology disclosed herein describes a semiconductor device assembly that includes a packaged semiconductor device having one or more semiconductor dies coupled to a package-level substrate. The package-level substrate has a first surface at which first contact pads are disposed in a first configuration. The packaged semiconductor device is coupled with an additional package-level substrate that includes a second surface having second contact pads disposed in the first configuration and a third surface having third contact pads disposed in a second configuration different from the first configuration. The additional package-level substrate includes circuitry coupling the second contact pads with the third contact pads to provide connectivity at the third contact pads. In doing so, an adaptively compatible semiconductor device may be assembled.

The technology disclosed herein relates to semiconductor devices, systems with semiconductor devices, and related methods for manufacturing semiconductor devices. The term "semiconductor device" generally refers to a solid-state device that includes one or more semiconductor materials. Examples of semiconductor devices include logic devices, memory devices, and diodes, among others. Furthermore, the term "semiconductor device" can refer to a finished device or to an assembly or other at various stages of processing before becoming a finished device. Depending upon the context in which it is used, the term "substrate" can refer to a structure that supports electronic components (e.g., a die), such as a printed circuit board (PCB) or wafer-level substrate, a die-level substrate, or another die for die-stacking or 3DI applications.

Although some examples may be illustrated or described with respect to dies or wafer, the technology disclosed herein may apply to dies or wafers. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

As used herein, the terms "vertical," "lateral," "upper" and "lower" can refer to relative directions or positions of features in the semiconductor die assemblies in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down and left/right can be interchanged depending on the orientation.

Figure 2:
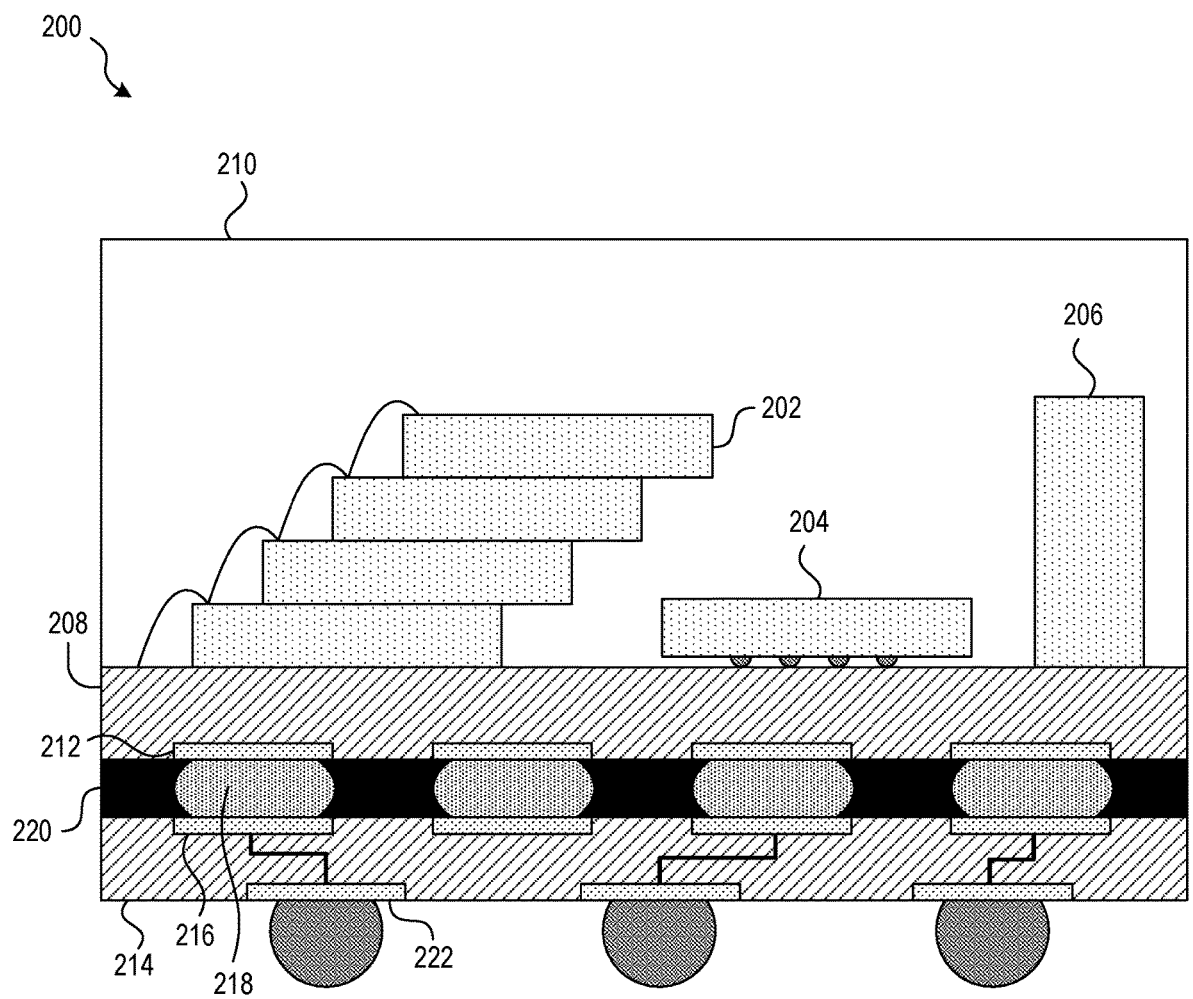
FIG. 2 illustrates a simplified schematic cross-sectional view of a semiconductor device assembly in accordance with an embodiment of the present technology.

FIG. 2 illustrates a simplified schematic cross-sectional view of a semiconductor device assembly 200 in accordance with an embodiment of the present technology. The semiconductor device assembly 200 includes multiple circuit components, such as memory dies 202, a logic die 204, and a capacitor 206. The multiple circuit components may couple with a package-level substrate 208 at a coupling surface. The package-level substrate 208 may be a PCB or any other substrate, for example, a semiconductor die or a substrate made of semiconductor material. The circuit components may attach through any number of techniques, for example, wire bonding, solder bumps, copper pillars, etc. The upper surface of the package-level substrate 208 may include contact pads (not shown) at which the circuit components may be electrically coupled to enable communications between the circuit components and the package-level substrate 208. The contact pads at the upper surface may connect to circuitry (e.g., traces, lines, vias, wires, etc.) at the package-level substrate 208, which connect the contact pads at the upper surface with contact pads 212 at the lower surface of the package-level substrate 208. The contact pads 212 may enable the multiple circuit components to electrically couple with external circuit components to provide various functionality to the multiple circuit components (e.g., power, ground, I/O signals, etc.). The multiple circuit components and the package-level substrate 208 may be at least partially encapsulated by an encapsulant 210 to protect the circuit components from interferences (e.g., moisture, particulates, static electricity, and physical impact).

In some implementations, the multiple circuit components coupled with the package-level substrate 208 and encapsulated by the encapsulant 210 may be referred to as a "packaged semiconductor device." The packaged semiconductor device may be any appropriate semiconductor device. For example, the packaged semiconductor device may be a memory device, such as a dynamic random-access memory (DRAM) device, NOT-AND (NAND) memory device, NOT-OR (NOR) memory device, magnetic random-access memory (MRAM) device, phase change memory (PCM) device, ferroelectric random-access memory (FeRAM) device, static random-access memory (SRAM) device, or the like. In an embodiment in which multiple dies are provided in a single assembly, the semiconductor devices could include memory dies of a same kind (e.g., both NAND, both DRAM, etc.) or memory dies of different kinds (e.g., one DRAM and one NAND, etc.). In accordance with another aspect of the present disclosure, the packaged semiconductor devices could be logic devices (e.g., controller dies, processor dies, etc.), or devices having a mix of logic and memory dies (e.g., a memory controller die and a memory die controlled thereby).

The packaged semiconductor device may be compatible with any number of other circuit components, for example, based on a specification requested by a customer. The contact pads 212, which may be exposed at an exterior of the packaged semiconductor device, may be disposed at the package-level substrate 208 in a particular configuration to provide a certain compatibility to the packaged semiconductor device. For example, the contact pads 212 may be arranged according to a current, legacy, or future generation of the Universal Flash Storage (UFS) standard (e.g., UFS 1.X, UFS 2.X, UFS 3.X, UFS 4.X, UFS 5.X, etc., where "X" is any sub-version number such as 0, 1, 2, etc.) or any other standard (e.g., embedded MultiMediaCard (eMMC), Solid State Drives (SSD), Crossover Flash Memory (XFM), etc.) to provide compatibility with a similarly configured host device. Once packaged, the package-level substrate, and thus the configuration of the contact pads 212, may not be changed. Thus, in cases where multiple customers require the same functional specifications (e.g., the configuration of the multiple circuit components is identical) but the compatibility specification vary, separate semiconductor devices may be required for each customer.

As illustrated in the semiconductor device assembly 200 of FIG. 2, however, an additional package-level substrate 214 may be coupled with the package-level substrate 208 or the packaged semiconductor device to alter the compatibility of the packaged-semiconductor device. The additional package-level substrate 214 may include any appropriate substrate, for example, a PCB or a silicon substrate (e.g., interposer). The additional package-level substrate 214 may include an upper surface at which contact pads 216 are disposed in a configuration that corresponds to the configuration of the contact pads 212 at the package-level substrate 214. In this way, the packaged semiconductor device may couple to the additional package-level substrate 214 through the contact pads 212 at the package-level substrate 208 and the contact pads 216 at the additional package-level substrate 214. The contact pads 212 and the contact pads 216 may electrically couple through any appropriate interconnects. For example, solder joints 218 may be formed from solder balls disposed at the contact pads 212. The additional package-level substrate 214 may be brought into contact with the solder balls at the contact pads 216, and the solder balls may be heated to reflow the solder material and form the solder joints 218 between the packaged semiconductor device and the additional package-level substrate 214. Underfill material 220 (e.g., molded underfill, capillary underfill, etc.) may be disposed between the package-level substrate 208 and the additional package-level substrate 214 to insulate the interconnects or mechanically support the coupling of the package-level substrate 208 and the additional package-level substrate 214.

The additional package-level substrate 214 may additionally include contact pads 222 at a lower surface. The contact pads 222 at the lower surface may be disposed in a configuration that is different than the contact pads 216 at the upper surface, for example, a different generation of the UFS standard or any other standard. The additional package-level substrate 214 may include circuitry (e.g., traces, vias, and other conductive structures) connecting the contact pads 216 at the upper surface with the contact pads 222 at the lower surface (illustrated schematically in FIG. 2). The circuitry may route contact pads 216 to contact pads 222 at the lower surface that are used for a same purpose (e.g., power, ground, I/O signaling). In some implementations, the additional package-level substrate 214 may be a two-layer substrate with routing circuitry (e.g., vias or other connective structures) connecting a first layer having the contact pads 216 and a second layer having the contact pads 222. In other implementations, the additional package-level substrate 214 may include additional layers, which may include layers of logical circuitry implemented at the additional package-level substrate 214. Solder balls or any other connective element may be disposed at the contact pads 222 of the additional package-level substrate 214 to enable the additional package-level substrate, and thus the packaged semiconductor device, to couple to external circuit components (e.g., a PCB at a host device) compatible with the configuration of the contact pads 222 of the additional package-level substrate 214. As a result, the additional package-level substrate 214 may provide a mechanism to adapt the compatibility of a packaged semiconductor device, thereby enabling cross-compatibility of semiconductor devices post packaging and reducing the design time needed to produce similarly capable semiconductor devices with various compatibilities.

Figure 3:
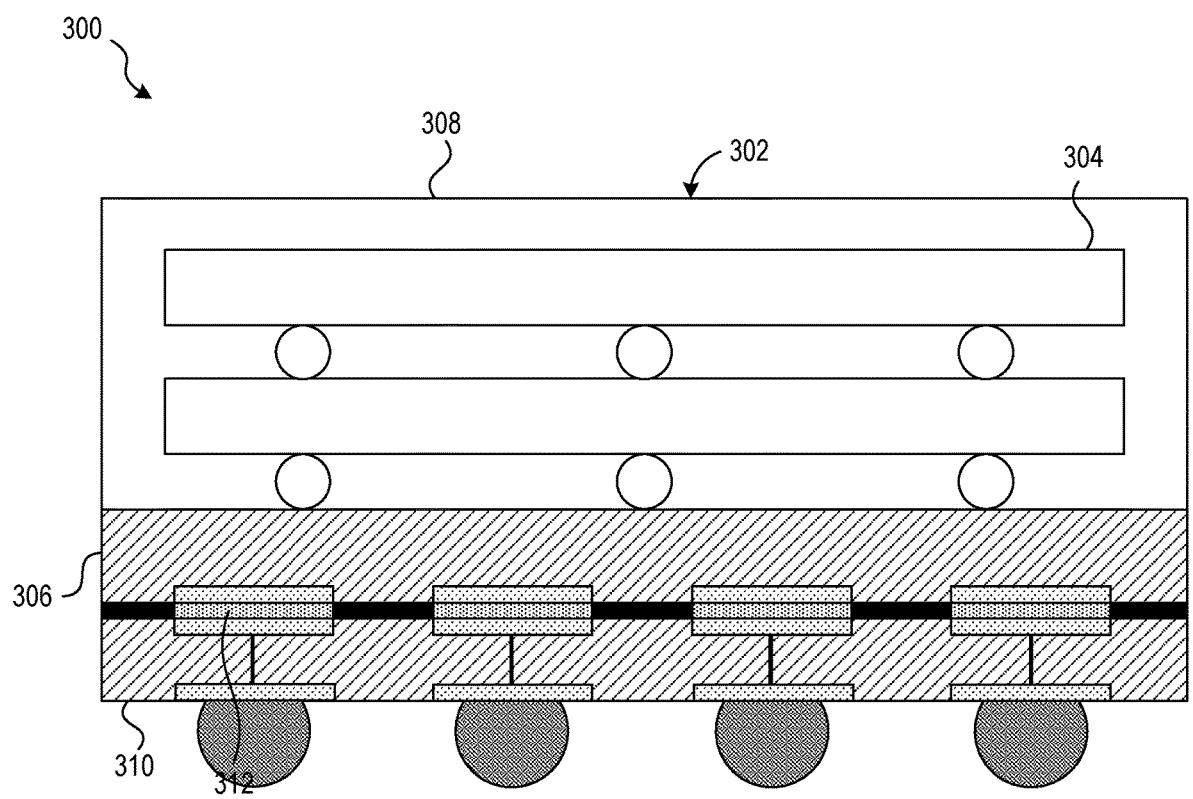
FIG. 3 illustrates a simplified schematic cross-sectional view of a semiconductor device assembly in accordance with an embodiment of the present technology.

FIG. 3 illustrates a simplified schematic cross-sectional view of a semiconductor device assembly 300, including a packaged semiconductor device 302. In contrast to the packaged semiconductor device illustrated in FIG. 2, the packaged semiconductor device 302 may include stacked semiconductor dies 304 mounted on and electrically coupled with the package-level substrate 306. It should be noted, however, that the packaged semiconductor device may include any number of circuit components or semiconductor dies arranged in any particular configuration. The stacked semiconductor dies 304 and the package-level substrate 306 may be at least partially encapsulated by an encapsulant 308 to protect the stacked semiconductor dies 304 or the package-level substrate 306 from interferences. Similar to the packaged semiconductor device described with respect to FIG. 2, the packaged semiconductor device 302 may include the package-level substrate 306 with contact pads disposed at a lower surface and exposed at the exterior of the packaged semiconductor device 302. The packaged semiconductor device 302 may be coupled with an additional package-level substrate 310 that alters the compatibility of the packaged semiconductor device 302. The packaged semiconductor device 302 and the package-level substrate 310 may couple through interconnects. For example, solder paste 312 disposed at contact pads between the packaged semiconductor device 302 and the package-level substrate 310. The package-level substrate 310 may include circuitry (illustrated schematically in FIG. 3) that couples the contact pads at which the solder paste 312 is implemented with contact pads at the lower surface that are disposed in a different configuration. As a result, the semiconductor device assembly 300 may be compatible with an additional circuit component having a configuration corresponding to the configuration of the contact pads at the lower surface of the additional package-level substrate 310.

Figure 4:
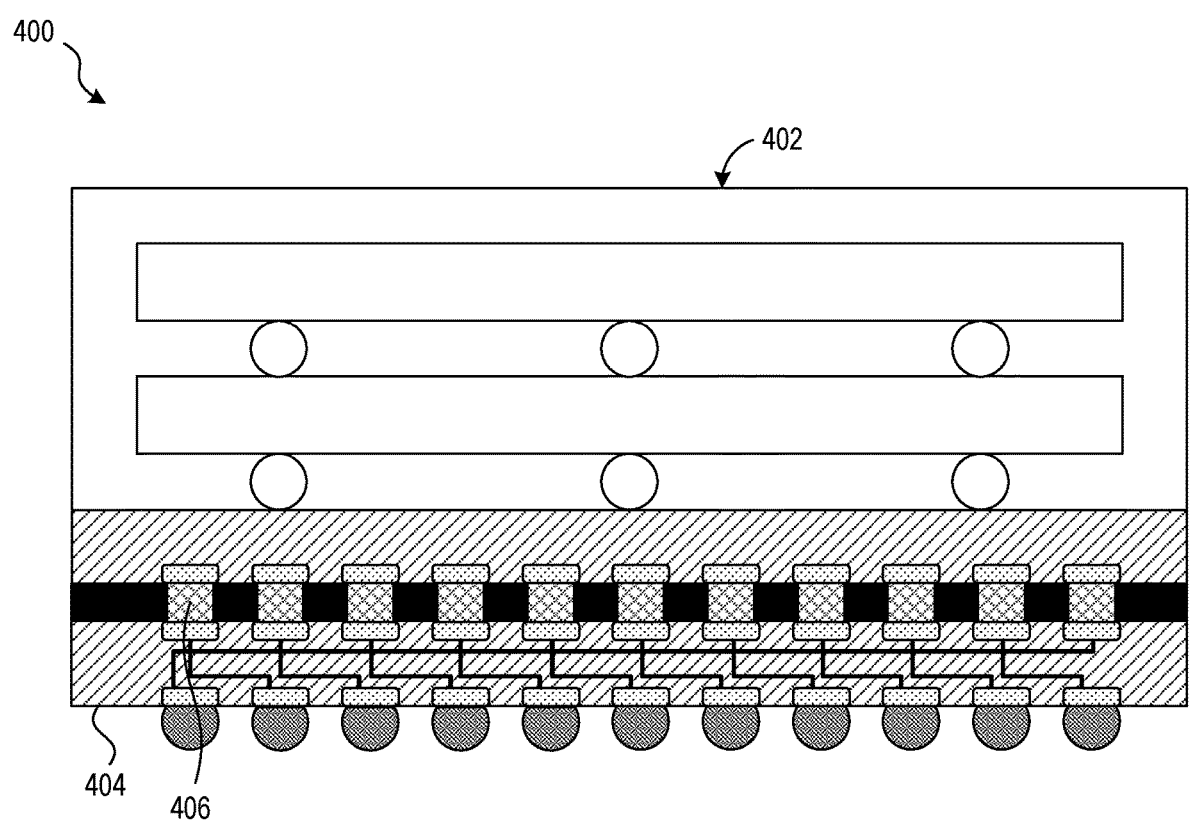
FIG. 4 illustrates a simplified schematic cross-sectional view of a semiconductor device assembly in accordance with an embodiment of the present technology.

FIG. 4 illustrates a simplified schematic cross-sectional view of a semiconductor device assembly 400, including a packaged semiconductor device 402 coupled to an additional package-level substrate 404. The packaged semiconductor device 402 may be similar to or different from either of the packaged semiconductor devices illustrated in FIG. 2 or 3. In contrast to the packaged semiconductor device illustrated in FIGS. 2 and 3, the packaged semiconductor device 402 may couple with the additional package-level substrate 404 through conductive pillars 406 (e.g., composed of copper, gold, silver, tin, aluminum, or an alloy of these materials). The conductive pillars 406 may be implemented between contact pads at the packaged semiconductor device 402 and contact pads at the additional package-level substrate 404 that are disposed in a same configuration. The additional package-level substrate 404 may include circuitry (illustrated schematically in FIG. 4) that couples the contact pads coupled with the conductive pillars 406 with contact pads at the lower surface that are disposed in a different configuration. Solder balls or other connective elements may be implemented at the contact pads at the lower surface to enable the packaged semiconductor device 402 to couple to an additional circuit component (e.g., through the additional package-level substrate 404) having contact pads corresponding to the solder balls.

Figure 5:
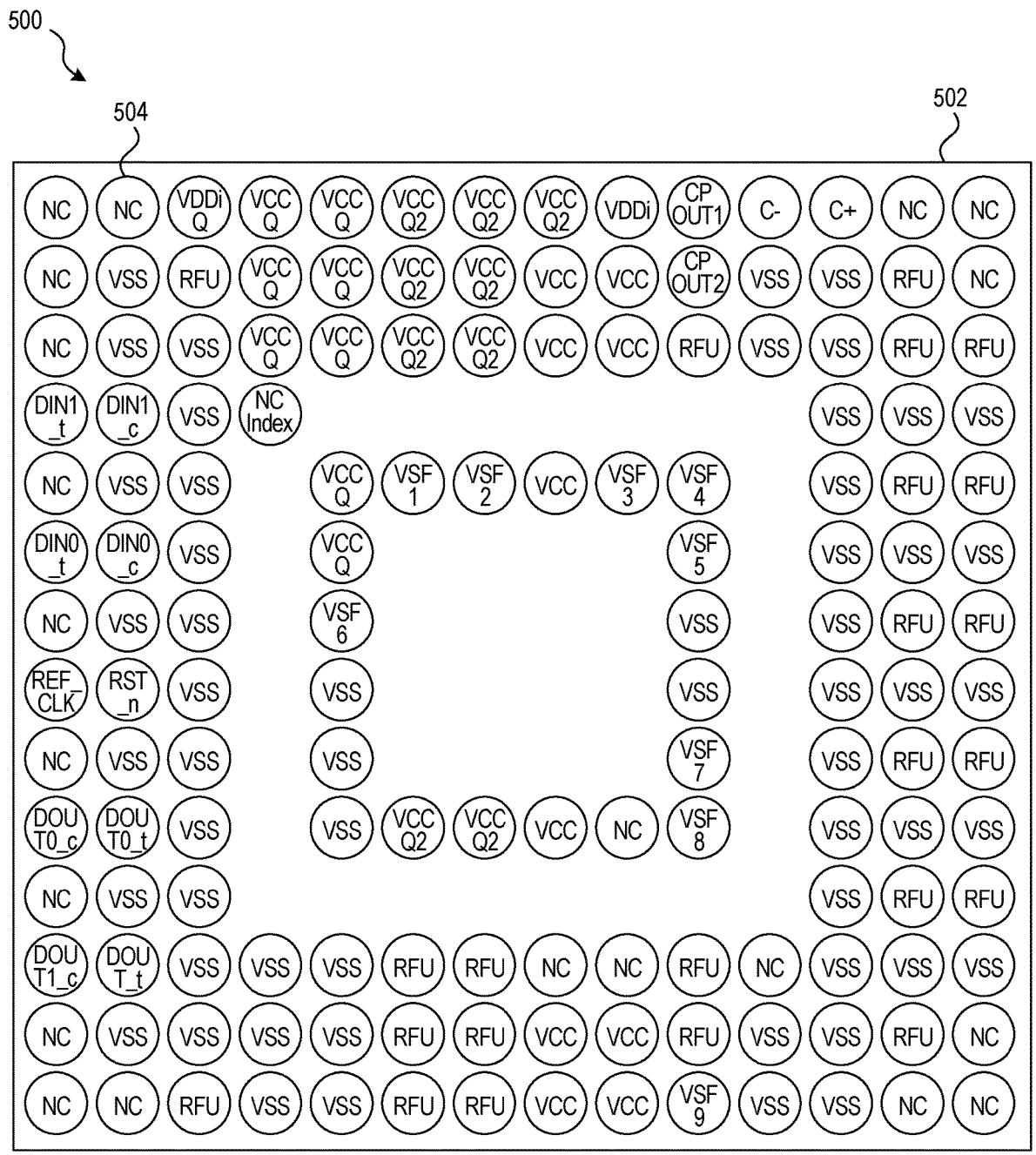
FIG. 5 illustrates a schematic partial plan view of a semiconductor device assembly in accordance with an embodiment of the present technology.
Figure 6:
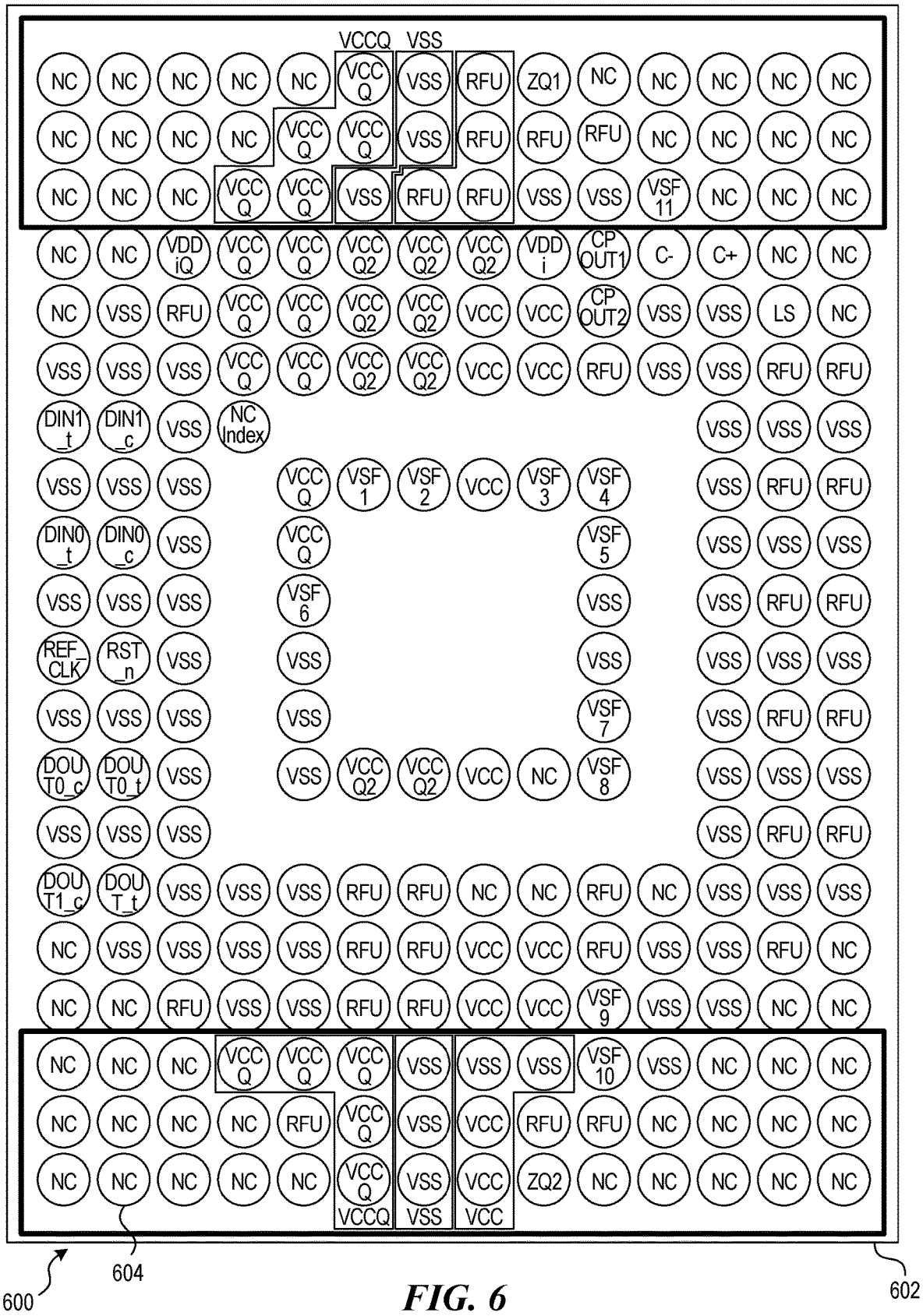
FIG. 6 illustrates a schematic partial plan view of a semiconductor device assembly in accordance with an embodiment of the present technology.

This disclosure now turns to FIGS. 5 and 6, which illustrate example configurations of contact pads at a packaged semiconductor device in accordance with multiple generations of the UFS standard, however, it should be appreciated that contact pads may be disposed in accordance with other generations of the UFS standard or with other standards. The example configurations may correspond to a schematic partial plan view of the exposed coupling surface of the packaged semiconductor device (e.g., the lower surface as illustrated in FIGS. 2 through 4) or a surface of the additional package-level substrate. For example, the packaged semiconductor device and a first surface of the additional package-level substrate may have contact pads disposed in accordance with the UFS 3.X standard, and a second surface of the additional package-level substrate may have contact pads disposed in accordance with the UFS 4.X standard, or vice versa. In some instances, the packaged semiconductor device and the first surface of the additional package-level substrate may be designed in accordance with a more complex wiring (e.g., in accordance with the UFS 4.X standard), and the additional package-level substrate may route the contact pads at the first surface to contact pads at the second surface that are designed in accordance with a less complex wiring (e.g., in accordance with the UFS 3.x standard).

FIG. 5 illustrates a schematic partial plan view of a semiconductor device assembly 500, including a package-level substrate 502 having a coupling surface with contact pads 504 disposed in accordance with the UFS 3.0 standard. Solder balls may be implemented at each of the contact pads to create a ball out grid array in accordance with the UFS 3.0 standard. The configuration of the contact pads 504 may specify a location and a usage of each contact pad. For instance, the contact pads 504 at the package-level substrate 502 are disposed in the particular pattern and the usage of each contact pad is specified. As illustrated, the usage of each of the contact pads 504 is specified by label. The contact pads 504 may utilized for different types of communications, such as supply signals (e.g., voltage, ground, etc.), input signals (e.g., reset signals, data inputs, clock signals, etc.), or output signals (e.g., data outputs). Other contact pads 504 may be connected to a ground or left floating, for example, to be reserved for future use or testing. The configuration may specify a particular number of contact pads that are used for communication with the semiconductor device. As illustrated, the package-level substrate 502 includes 153 contact pads.

FIG. 6 illustrates a schematic partial plan view of a semiconductor device assembly 600, including a package-level substrate 602 having a coupling surface with contact pads 604 disposed in accordance with the UFS 4.0 standard. Solder balls may be implemented at each of the contact pads to create a ball out grid array in accordance with the UFS 4.0 standard. Similar to the package-level substrate described with respect to FIG. 5, the contact pads 604 at the package-level substrate 602 are disposed in the particular pattern and the usage of each contact pad is specified based on the UFS 4.0 standard. The contact pads 604 may be utilized for similar communications as the contact pads described with respect to FIG. 5. For example, the contact pads 604 may facilitate the communication of supply signals (e.g., voltage, ground, etc.), input signals (e.g., reset signals, data inputs, clock signals, etc.), or output signals (e.g., data outputs). Other contact pads 604 may be connected to a ground or left floating, for example, to be reserved for future use or testing. In contrast to the contact pads described with respect to FIG. 5 and disposed in accordance with the UFS 3.0 standard, the contact pads 604 include 237 contact pads.

In some implementations, the package-level substrate 502 or the package-level substrate 602 illustrated in FIGS. 5 and 6, respectively, may be an exposed coupling surface of a package-level substrate of a packaged semiconductor device (e.g., the package-level substrate 208 illustrated in FIG. 2). The package-level substrate may couple to various circuit components within the packaged semiconductor device at a coupling surface opposite the illustrated surface. The package-level substrate may include internal circuitry that couples a connection between the package-level substrate and the circuit components to an appropriate contact pad of the contact pads illustrated in FIG. 5 or 6 (e.g., based on usage). In doing so, the packaged semiconductor device may be compatible with an additional circuit component (e.g., a PCB at a host device) that uses a similar configuration of contact pads (e.g., UFS 3.0, UFS 4.0, etc.).

In some implementations, the package-level substrate 502 and the package-level substrate 602 illustrated in FIGS. 5 and 6, respectively, may be an additional package-level substrate (e.g., the package-level substrate 208 illustrated in FIG. 2) that is coupled with a packaged semiconductor device to alter the compatibility of the packaged semiconductor device. The schematic partial plan view in FIGS. 5 and 6 may illustrate opposite surfaces of the additional package-level substrate having different configurations of contact pads. The additional package-level substrate may include internal circuitry that couples the contact pads at one surface to the contact pads at the opposite surface. A contact pad at the first surface may be coupled to a contact pad at the opposite surface that has a same usage. In this way, the configuration of contact pads at a coupling surface may be altered without requiring the usage of the contact pads at the packaged semiconductor device to be reconfigured. In some implementations, the first surface of the additional-package substrate may have a different number of contact pads compared to the opposite surface (e.g., one surface has contact pads disposed in a UFS 3.X configuration and the other surface has contact pads disposed in a UFS 4.X configuration). Thus, the circuitry at the additional-package-level substrate may not route one-to-one between the contact pads on each surface. In this case, some contact pads may not be connected at the opposite surface or multiple contact pads at one surface may couple with a same contact pad at the opposite surface.

Figure 7:
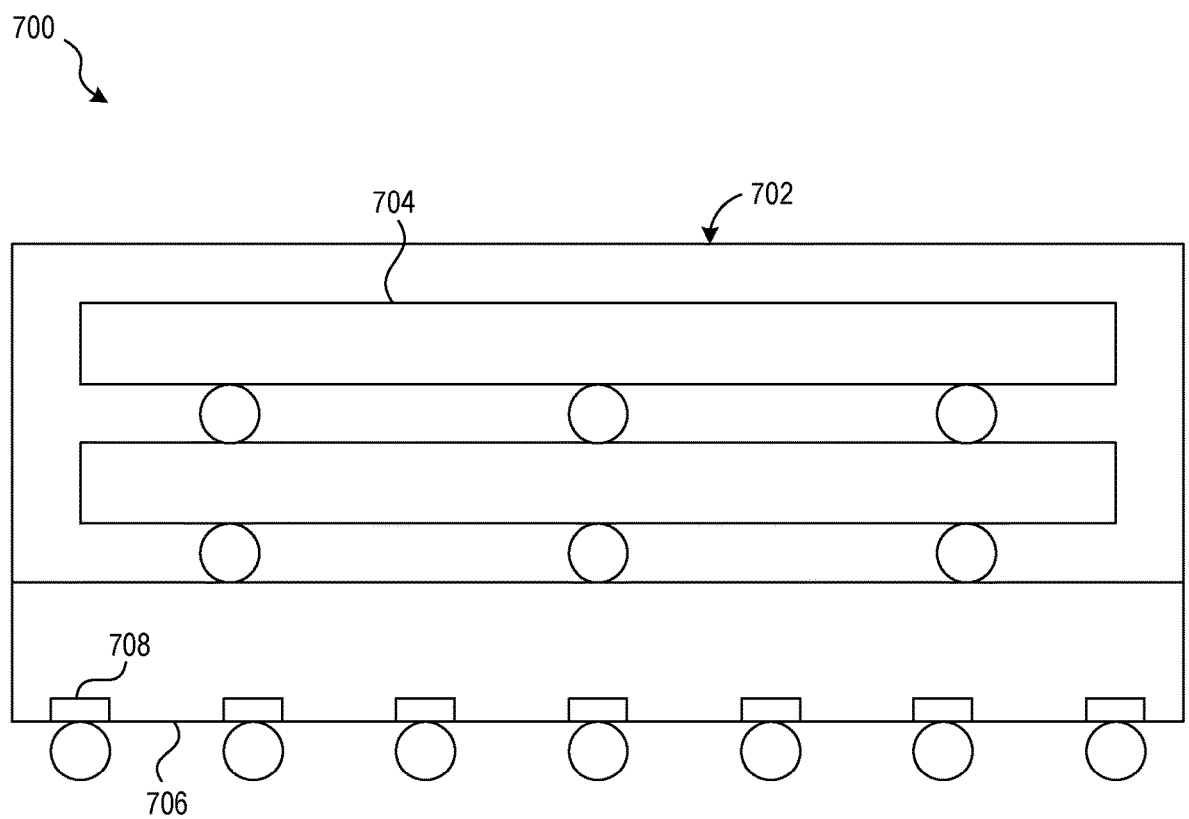
FIGS. 7-8 illustrate simplified schematic cross-sectional views of a series of fabrication steps of semiconductor device assemblies in accordance with an embodiment of the present technology.
Figure 8:
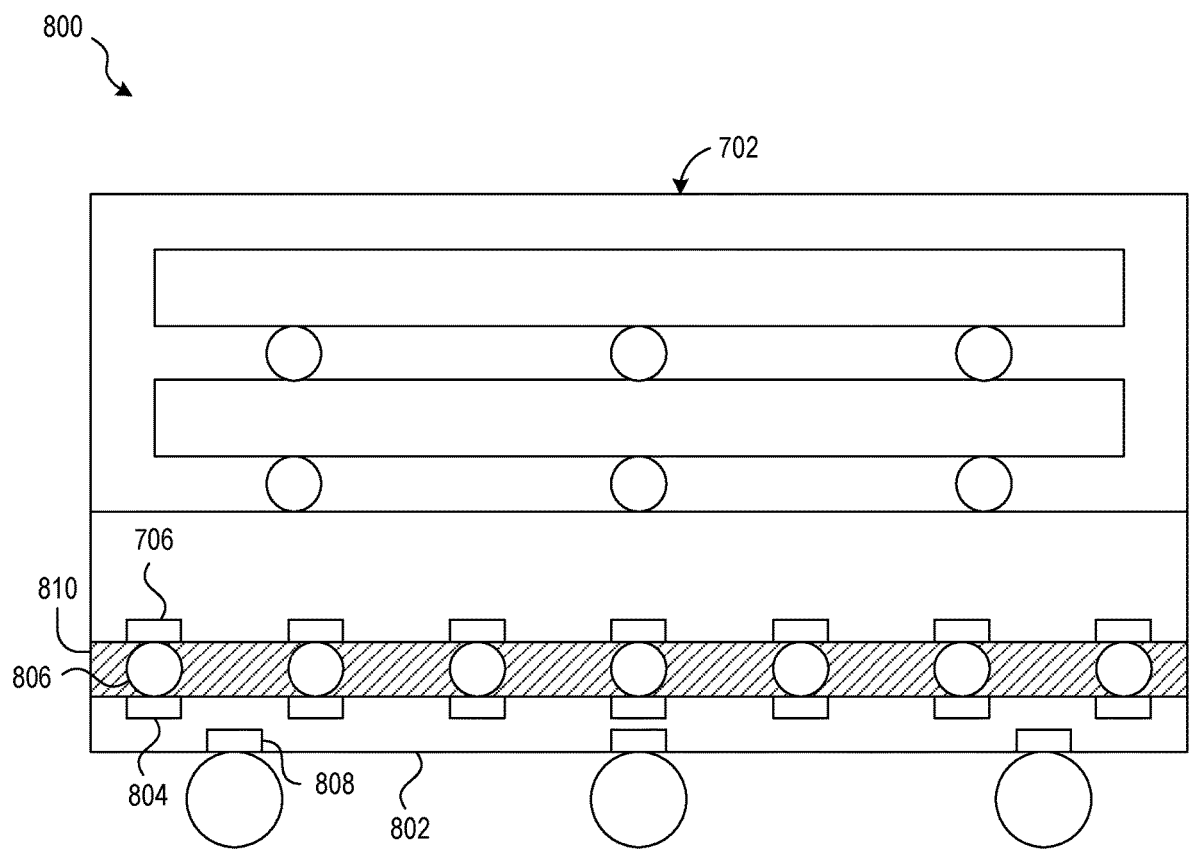

FIGS. 7 and 8 illustrate simplified schematic cross-sectional views of a series of fabrication steps of semiconductor device assemblies in accordance with an embodiment of the present technology. As illustrated in FIG. 7, the method may include a stage 700 for providing a semiconductor device 702. The semiconductor device 702 may include stacked semiconductor dies 704 coupled to a package-level substrate 706. The package-level substrate 706 may include contacts (e.g., pads) at which the semiconductor dies 704 couple and which connect to contact pads 708 exposed at an exterior of the packaged semiconductor device. The contact pads 708 may be disposed in a particular configuration to enable compatibility with external devices, for example, based on a specification requested by a customer to enable the packaged semiconductor device 702 to be implemented within a host device. In some instances, this configuration may be different than the configuration needed to make the packaged semiconductor device 702 compatible with external components used by a different customer. As a result, the packaged semiconductor device 702 may not be installed, as is, within the devices of some customers.

As illustrated in FIG. 8, the method may include a stage 800 for selecting an additional package-level substrate 802 to alter the compatibility of the packaged semiconductor device 702 to enable the packaged semiconductor device 702 to be installed on a PCB (e.g., motherboard) or other circuit component of a host device. The additional package-level substrate 802 may be selected from a plurality of package-level substrates, each having respective first and second surfaces with contact pads disposed in various configurations. The additional package-level substrate 802 may have a first surface that has contact pads 804 disposed in a configuration that corresponds to the configuration of the contact pads 708 at the packaged semiconductor device 702 to enable interconnects 806 to electrically couple the contact pads 708 and the contact pads 804. The additional package-level substrate 802 may further include a second surface that has contact pads 808 disposed in a configuration that is the same as the configuration of contact pads at a PCB or other component of a host device in which the packaged semiconductor die 702 is to be implemented.

Once selected, the packaged semiconductor die 702 may be electrically coupled to the additional package-level substrate 802 through the interconnects 806 at the contact pads 708 and the contact pads 804. As a result, the contact pads 808 may provide exposed connections coupled with the packaged semiconductor device 702 to enable the packaged semiconductor device 702 to couple with a PCB or other component of the host device through the additional package-level substrate 802. An underfill material 810 may be disposed between the packaged semiconductor device 702 and the additional package-level substrate 802 or an encapsulant may at least partially encapsulate the packaged semiconductor device 702 and the additional package-level substrate 802.

Figure 9:
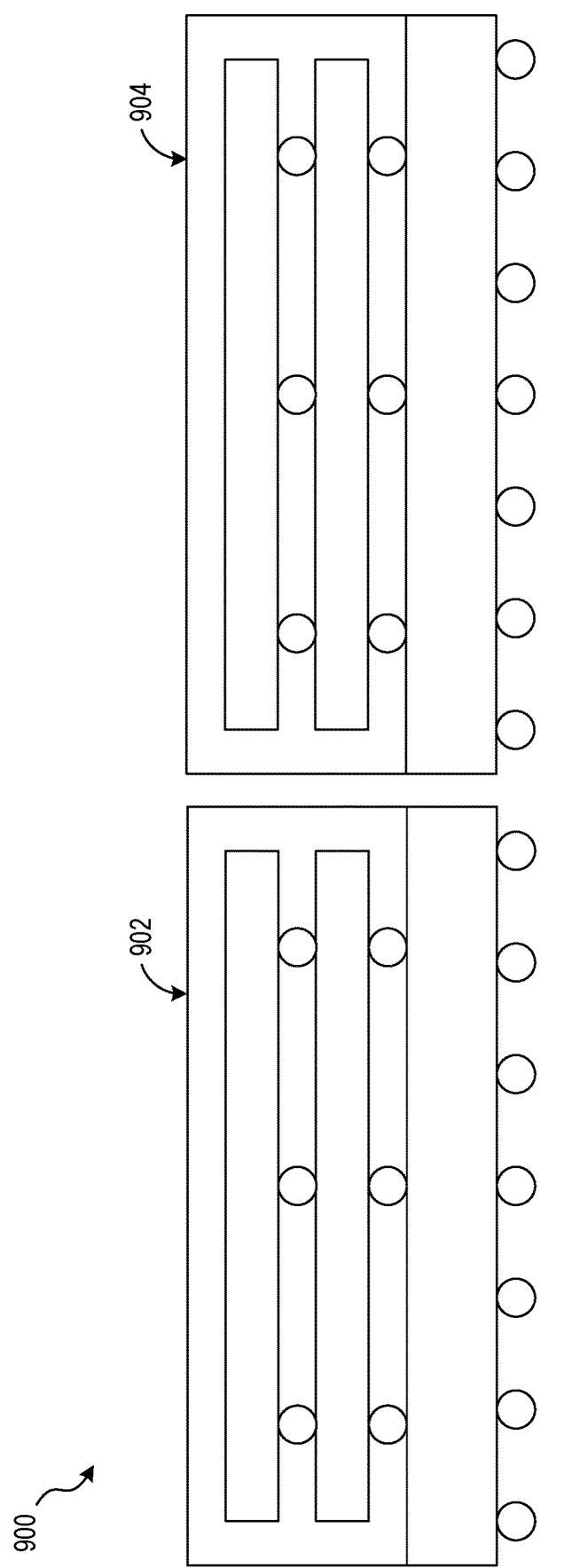
FIG. 9-12 illustrates a simplified schematic cross-sectional view of a semiconductor device assembly in accordance with an embodiment of the present technology.
Figure 10:
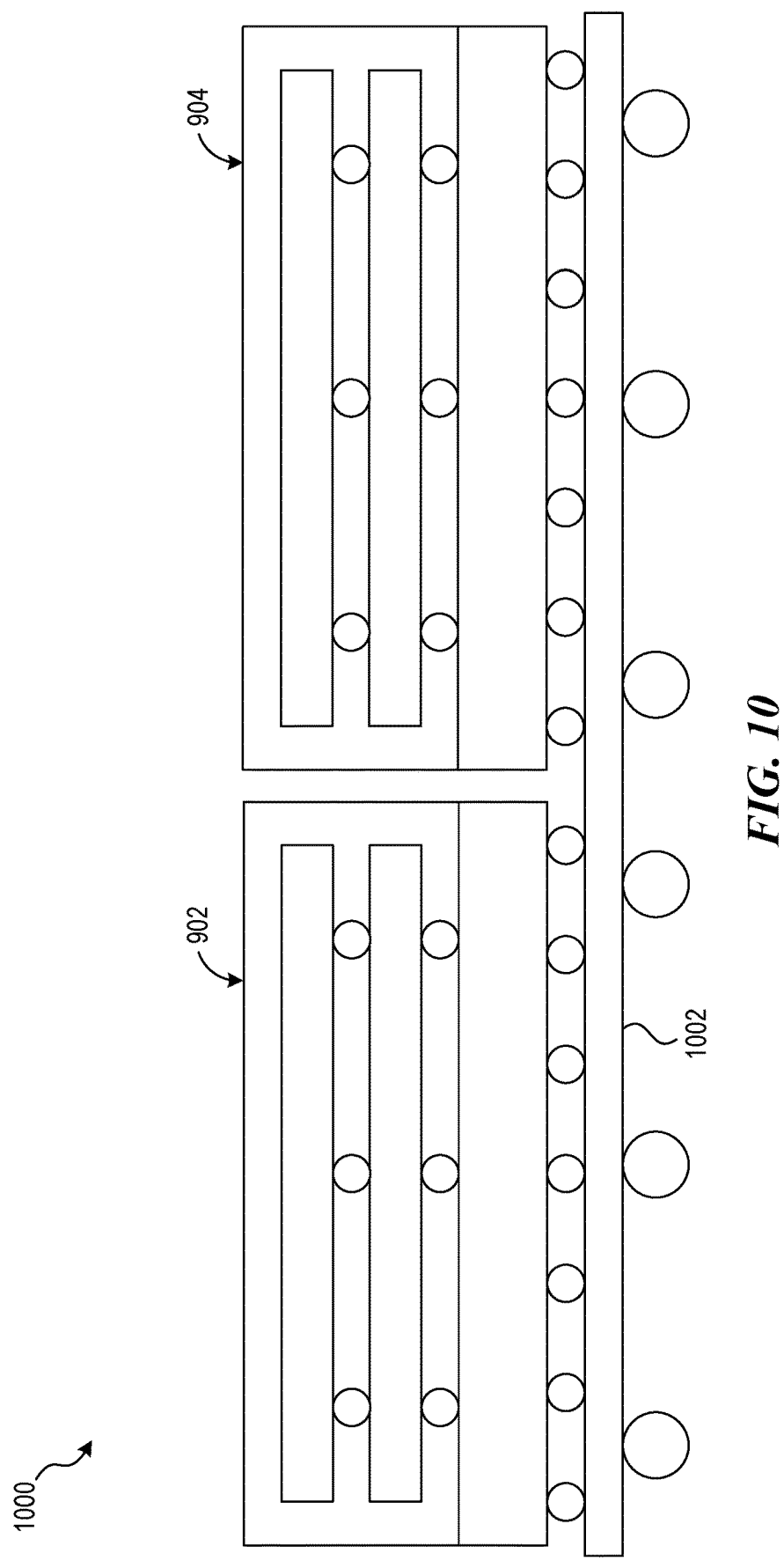
Figure 11:
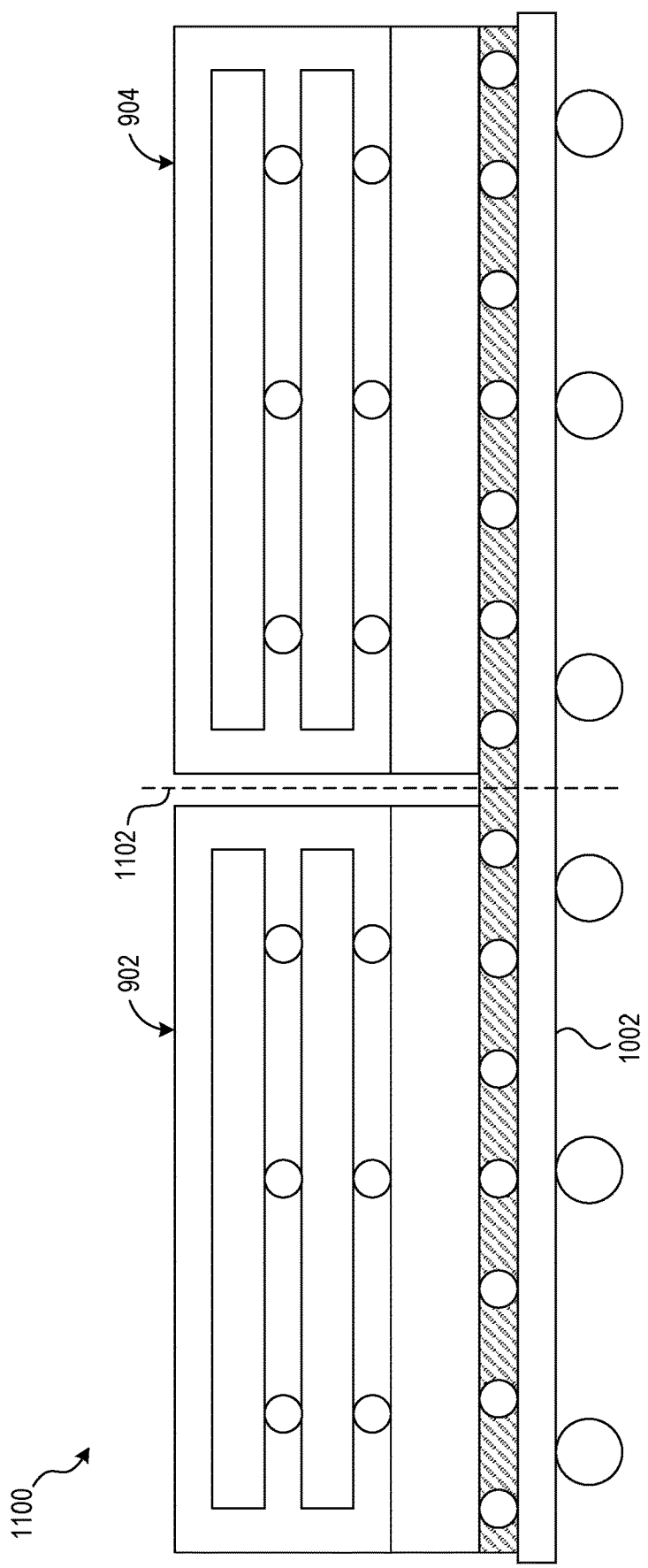

FIGS. 9 through 11 illustrate simplified schematic cross-sectional views of a series of fabrication steps of semiconductor device assemblies in accordance with an embodiment of the present technology. In contrast to the series of fabrication steps illustrated in FIGS. 7 and 8, the fabrication steps illustrated in FIG. 9 through 11 may fabricate multiple semiconductor device assemblies onto an additional package-level substrate. The additional package-level substrate may then be separated to create a plurality of semiconductor devices.

As illustrated in FIG. 9, the method may include a stage 900 for providing a plurality of packaged semiconductor devices, including a packaged semiconductor device 902 and a packaged semiconductor device 904. The plurality of packaged semiconductor devices may include a same set of circuit components to implement the same function or different circuit components to implement different functions. While the functional components of the die may differ, the configuration of the contact pads at an exterior of the packaged semiconductor devices may be the same. The packaged semiconductor devices may be a finished semiconductor device that was initially designed to satisfy first compatibility requirements; however, the compatibility of the packaged semiconductor devices may now be changed to enable the devices to be compatible with a different host device.

As illustrated in FIG. 10, the method may include a stage 1000 for electrically coupling the packaged semiconductor device 902 and the packaged semiconductor device 904 with an additional package-level substrate 1002. The additional package-level substrate 1002 may include contact pads at a first surface that are disposed in a configuration that corresponds to the contact pads at the packaged semiconductor devices and contact pads at a second surface that are disposed in a different configuration. The packaged semiconductor devices may be mounted on the additional package-level substrate 1002 at different lateral locations. In some instances, there may be a gap between each of the packaged semiconductor devices when they are mounted on the additional package-level substrate 1002. The additional package-level substrate 1002 may be designed to support any number of configuration of packaged semiconductor devices.

As illustrated in FIG. 11, the method may include a stage 1100 for separating the additional package-level substrate 1002 to separate the packaged semiconductor device 902 and the packaged semiconductor device 904. The additional package-level substrate 1002 may be separated along a cut line 1102 between the packaged semiconductor device 902 and the packaged semiconductor device 904. The additional package-level substrate 1002 may be separated through any appropriate technique (e.g., sawing, etching, etc.) to separate the additional package-level substrate 1002. Before or after separating, an underfill material may be dispensed between the packaged semiconductor device 902 or the packaged semiconductor device 904 and the additional package-level substrate 1002.

Figure 12:
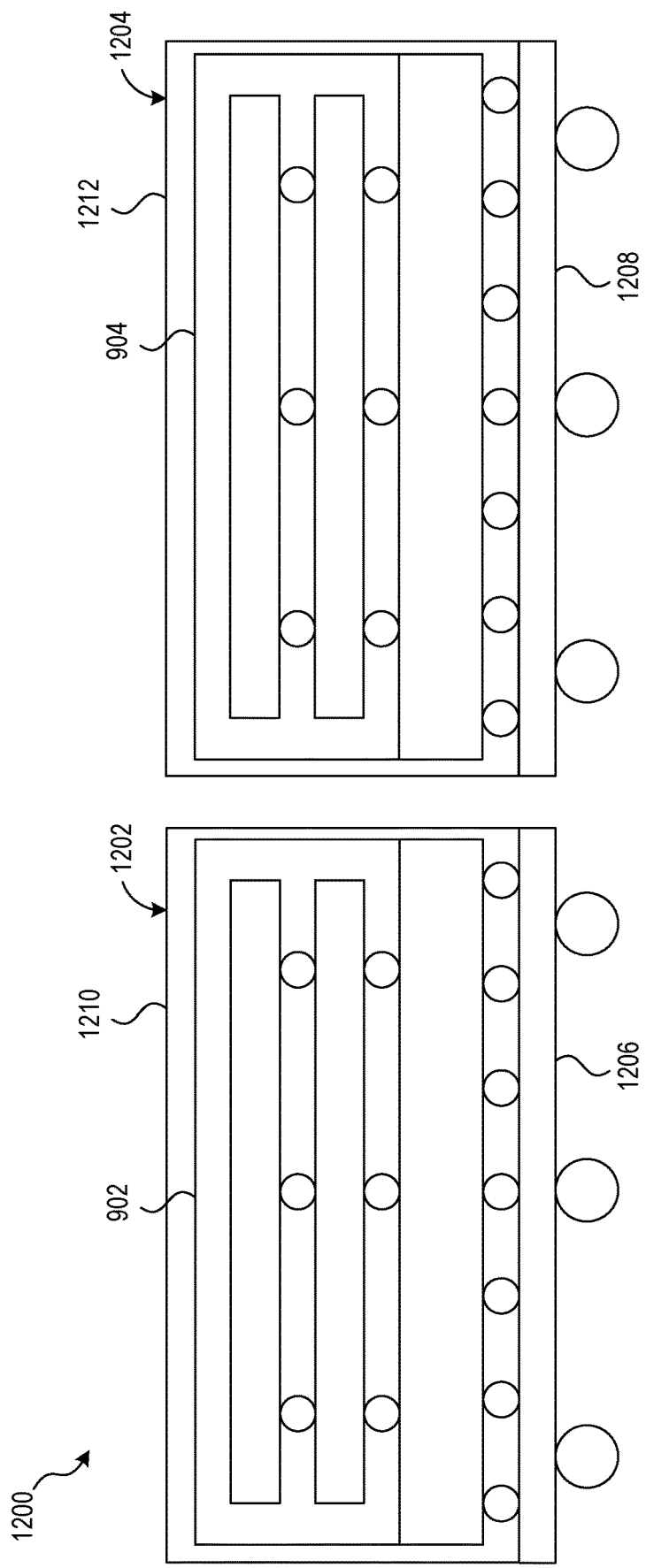

As illustrated in FIG. 12, the method may include a stage 1200 for providing the packaged semiconductor device 1202 and the packaged semiconductor device 1204, which may include the packaged semiconductor device 902 and an additional package-level substrate 1206 and the packaged semiconductor device 904 and an additional package-level substrate 1208, respectively. The packaged semiconductor device 1202 and the packaged semiconductor device 1204 may have a different compatibility than the packaged semiconductor device 902 and the packaged semiconductor device 904 due to the additional package-level substrate 1206 and the additional package-level substrate 1208. Given that the additional package-level substrate is separated between the packaged semiconductor devices, the additional package-level substrate 1206 and the additional package-level substrate 1208 may have a surface area (e.g., at the coupling surface) that is larger than a surface area of the packaged semiconductor device 902 (e.g., at the package-level substrate) and the packaged semiconductor device 904 (e.g., at the package-level substrate), respectively. Once separated, the packaged semiconductor device 1202 and the packaged semiconductor device 1204 may be encapsulated by an encapsulant 1210 and encapsulant 1212, respectively. In this way, the compatibility of the packaged semiconductor device 902 and the packaged semiconductor device 904 may be altered to produce the packaged semiconductor device 1202 and the packaged semiconductor device 1204.

Although the foregoing example semiconductor device assemblies have been illustrated and described as including a particular number of semiconductor dies, in other embodiments, assemblies can be provided with more or less semiconductor dies. For example, the semiconductor devices illustrated in FIGS. 2 through 12 could be replaced with semiconductor devices having any other number of semiconductor dies, mutatis mutandis.

Figure 13:
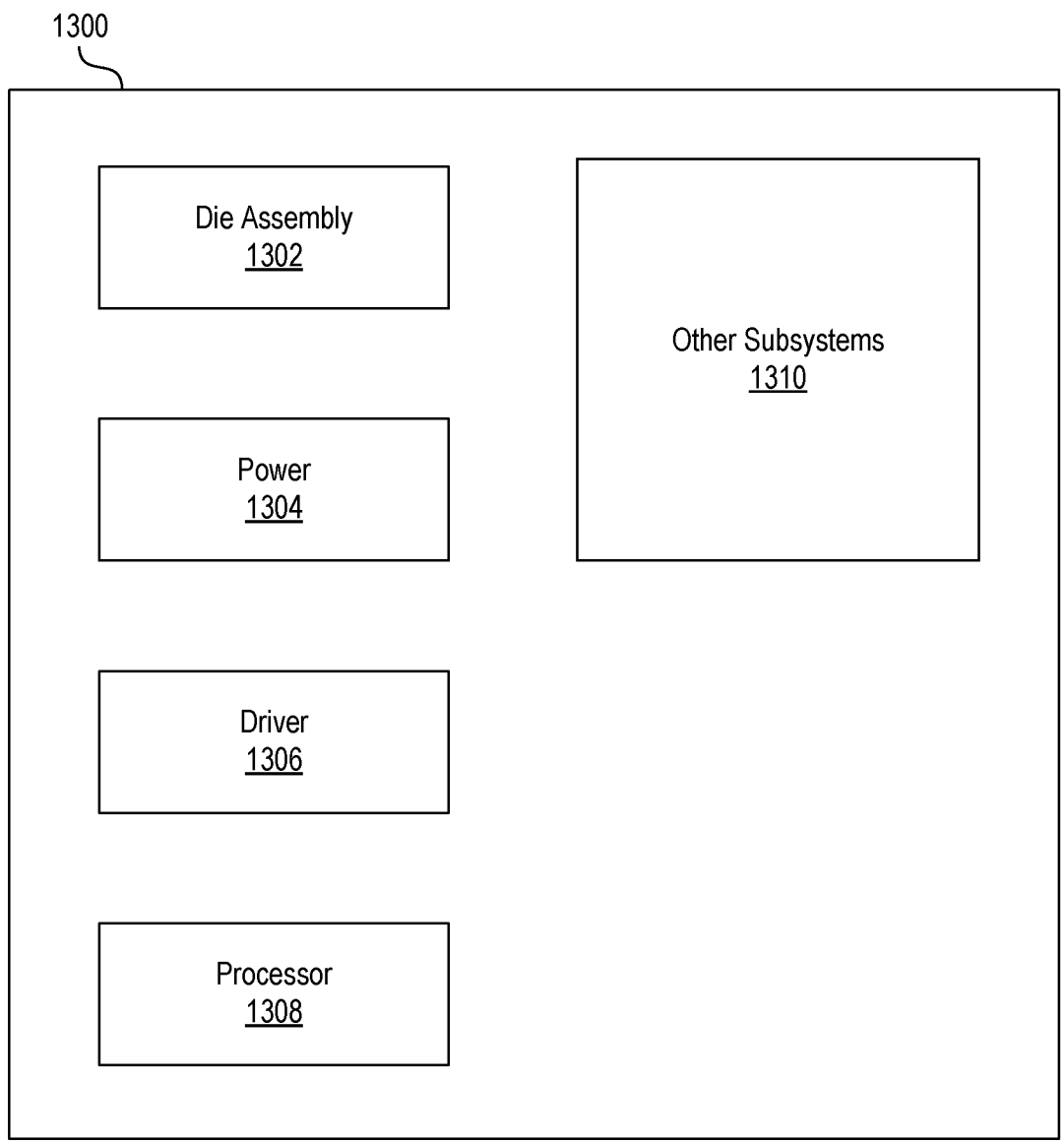
FIG. 13 illustrates a schematic view showing a system that includes a semiconductor device assembly configured in accordance with an embodiment of the present technology.

Any one of the semiconductor devices and semiconductor device assemblies described above with reference to FIGS. 2-12 can be incorporated into any of a myriad of larger and/or more complex systems, a representative example of which is system 1300 shown schematically in FIG. 13. The system 1300 can include a semiconductor device assembly 1302 (e.g., or a discrete semiconductor device), a power source 1304, a driver 1306, a processor 1308, and/or other subsystems or components 1310. The semiconductor device assembly 1302 can include features generally similar to those of the semiconductor devices described above with reference to FIGS. 2-12. The resulting system 1300 can perform any of a wide variety of functions, such as memory storage, data processing, and/or other suitable functions. Accordingly, representative systems 1300 can include, without limitation, hand-held devices (e.g., mobile phones, tablets, digital readers, and digital audio players), computers, vehicles, appliances and other products. Components of the system 1300 may be housed in a single unit or distributed over multiple, interconnected units (e.g., through a communications network). The components of the system 1300 can also include remote devices and any of a wide variety of computer-readable media.

Figure 14:
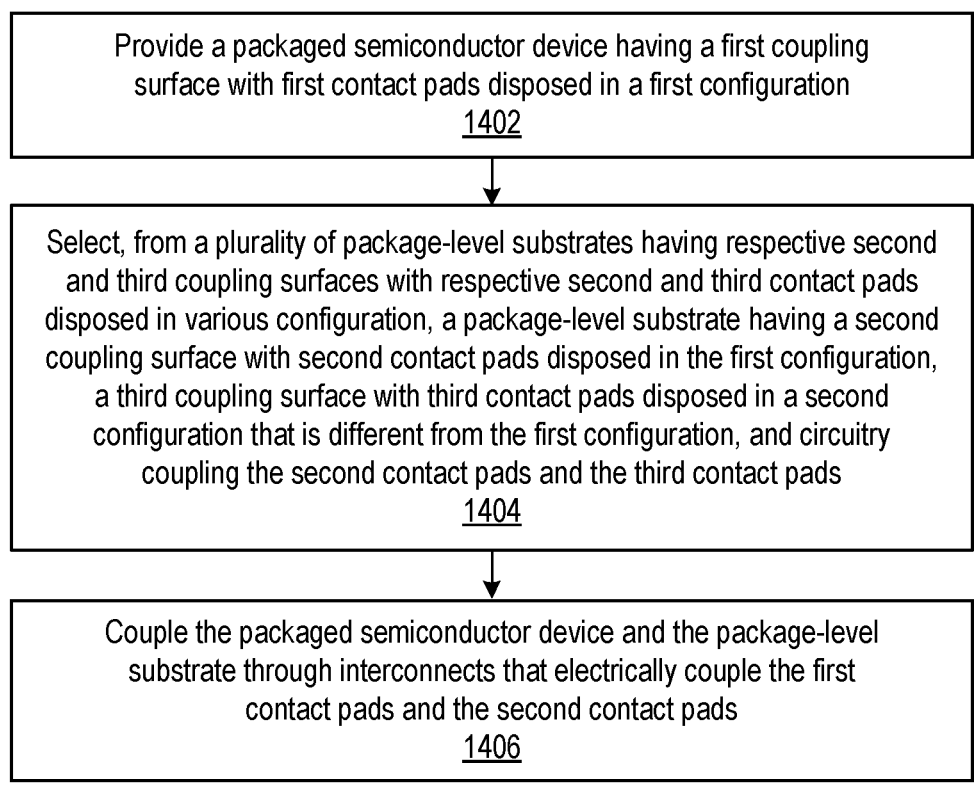
FIG. 14 illustrates an example method for fabricating a semiconductor device assembly in accordance with an embodiment of the present technology.

FIG. 14 illustrates an example method for fabricating a semiconductor device assembly in accordance with an embodiment of the present technology. The method 1400 may, for illustrative purposes, be described with respect to features, components, or elements of FIGS. 2-13. Although illustrated in a particular configuration, one or more operations of the method 1400 may be omitted, repeated, or reorganized. Additionally, the method 1400 may include other operations not illustrated in FIG. 14, for example, operations detailed in one or more other method described herein.

At 1402, a packaged semiconductor device 702 is provided. The packaged semiconductor device 702 may include a first coupling surface having first contact pads 708 disposed in a first configuration. In some implementations, an additional packaged semiconductor device may be provided that includes a coupling surface having contact pads disposed in the first configuration. The additional packaged semiconductor device may be a same or different packaged semiconductor device as the packaged semiconductor device 702.

At 1404, an additional package-level substrate 802 is selected from a plurality of package-level substrates having respective second and third coupling surfaces with contact pads disposed in various configurations. The additional package-level substrate 802 may be selected such that the second coupling surface has contact pads 804 disposed in the first configuration and the third coupling surface has contact pads 808 disposed in a second configuration that is different than the first configuration. The second configuration may correspond to the configuration of contact pads on a circuit component (e.g., a PCB) with which the packaged semiconductor device 702 is to be coupled. The additional package-level substrate 802 may include circuitry that couples the contact pads 804 to the contact pads 808. In implementations where multiple packaged semiconductor devices are provided, the additional package-level substrate 802 may include additional contact pads disposed in the first configuration at the second coupling surface and additional contact pads disposed in the second configuration at the third coupling surface. Circuitry may couple the additional contact pads.

At 1406, the packaged semiconductor device 702 and the additional package-level substrate 802 may be coupled through interconnects 806 that electrically couple the contact pads 804 and the contact pads 808. An underfill material 220 may be dispensed between the packaged semiconductor device 702 and the additional package-level substrate 802. In implementations where an additional packaged semiconductor device is provided, the additional packaged semiconductor device and the additional package-level substrate 802 may couple through additional interconnects. The additional package-level substrate 802 may be separated between the packaged semiconductor devices to separate the packaged semiconductor device. Thus, the performing the method 1400 may adjust the compatibility of a packaged semiconductor devices using an additional substrate to create a packaged semiconductor devices with a different compatibility.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor device assembly, comprising:
a packaged semiconductor device including:
one or more semiconductor dies,
a first package-level substrate, including:
a first coupling surface with first contact pads,
a second coupling surface with second contact pads disposed in a first configuration, and
first circuitry electrically coupling the first contact pads and the second contact pads, and
first interconnects electrically coupling the one or more semiconductor dies and the first package-level substrate at the first contact pads,
wherein the first configuration of the second contact pads is directly couplable with a first interface of a first host device that uses a first pinout, and
wherein the first package-level substrate is configured to provide the first host device access to the one or more semiconductor dies in the packaged semiconductor device; and
a second package-level substrate including:
a third coupling surface with third contact pads disposed in the first configuration,
a fourth coupling surface with fourth contact pads disposed in a second configuration different than the first configuration, and
second circuitry electrically coupling the third contact pads and the fourth contact pads,
wherein the second configuration of the fourth contact pads is directly couplable with a second interface of a second host device that uses a second pinout that is different than the first pinout; and
second interconnects electrically coupling the second contact pads of the first package-level substrate and the third contact pads of the second package-level substrate,
wherein the second package-level substrate and the second interconnects are configured to provide the second host device access to the one or more semiconductor dies in the packaged semiconductor device through the first package-level substrate.

2. The semiconductor device assembly of claim 1, wherein the second interconnects comprise solder joints.

3. The semiconductor device assembly of claim 1, wherein the second interconnects comprise conductive pillars.

4. The semiconductor device assembly of claim 1, wherein:
the first package-level substrate comprises a first printed circuit board; and
the second package-level substrate comprises a second printed circuit board.

5. The semiconductor device assembly of claim 4, wherein the second printed circuit board is a two-layer printed circuit board.

6. The semiconductor device assembly of claim 1, wherein the one or more semiconductor dies and the first package-level substrate are at least partially encapsulated by an encapsulant.

7. The semiconductor device assembly of claim 1, wherein the third contact pads include a different number of contact pads than the fourth contact pads.

8. The semiconductor device assembly of claim 1, wherein:
the first configuration comprises a universal flash storage 4.X configuration; and
the second configuration comprises a universal flash storage 3.X configuration.

9. The semiconductor device assembly of claim 1, wherein:
the first configuration comprises a universal flash storage 3.X configuration; and
the second configuration comprises a universal flash storage 4.X configuration.

10. The semiconductor device assembly of claim 1, further comprising an underfill material dispensed between the first package-level substrate and the second package-level substrate.

11. The semiconductor device assembly of claim 1, wherein the second package-level substrate has a larger surface area than the first package-level substrate.

12. A method of fabricating a semiconductor device comprising:
providing a packaged semiconductor device having a first package-level substrate comprising a first coupling surface with first contact pads disposed in a first configuration, wherein the first configuration of the first contact pads is directly couplable with a first interface of a first host device that uses a first pinout, and wherein the first package-level substrate is configured to provide the first host device access to one or more semiconductor dies in the packaged semiconductor device;
identifying, for coupling with the packaged semiconductor device, a second host device that uses a second pinout that is different than the first pinout, wherein the second pinout is associated with a second configuration of contact pads that is different than the first configuration, and wherein a second interface of the second host device is incompatible with the first package-level substrate of the packaged semiconductor device;
selecting, from a plurality of package-level substrates having respective second and third coupling surfaces with respective second and third contact pads disposed in various configurations based on the second configuration, a second package-level substrate having:
a second coupling surface with second contact pads disposed in the first configuration,
a third coupling surface with third contact pads disposed in the second configuration, the second configuration corresponding to a configuration of fourth contact pads on a printed circuit board of the second host device to which the packaged semiconductor device is to be coupled, and
circuitry coupling the second contact pads and the third contact pads,
wherein the second configuration of the third contact pads is directly couplable with the second interface of the second host device;
coupling the first package-level substrate of the packaged semiconductor device to the second package-level substrate through interconnects that electrically couple the first contact pads of the first package-level substrate and the second contact pads of the second package-level substrate, wherein the second package-level substrate and the interconnects are configured to provide the second host device access to the one or more semiconductor dies in the packaged semiconductor device through the first package-level substrate; and coupling, after coupling the first package-level substrate to the second package-level substrate, the packaged semiconductor device to the printed circuit board of the second host device.

13. The method of claim 12, wherein:
the second package-level substrate further has:
fifth contact pads disposed in the first configuration at the second coupling surface;
sixth contact pads disposed in the second configuration at the third coupling surface; and
the method further comprises:
providing an additional packaged semiconductor device having a fourth coupling surface with seventh contact pads disposed in the first configuration; and
coupling the additional packaged semiconductor device and the second package-level substrate through additional interconnects that electrically couple the seventh contact pads and the fifth contact pads.

14. The method of claim 13, further comprising separating the second package-level substrate between the packaged semiconductor device and the additional packaged semiconductor device to separate the packaged semiconductor device and the additional packaged semiconductor device.

15. The method of claim 12, further comprising dispensing an underfill material between the packaged semiconductor device and the second package-level substrate.

16. A semiconductor device assembly, comprising:
a packaged semiconductor device having a first package-level substrate comprising a first coupling surface with first contact pads disposed in a first configuration, wherein the first configuration of the first contact pads is directly couplable with a first interface of a first host device that uses a first pinout, and wherein the first package-level substrate is configured to provide the first host device access to one or more semiconductor dies in the packaged semiconductor device;
a printed circuit board including:
a second coupling surface with second contact pads disposed in the first configuration,
a third coupling surface with third contact pads disposed in a second configuration different than the first configuration, and
circuitry electrically coupling the second contact pads and the third contact pads, wherein the second configuration of the third contact pads is directly couplable with a second interface of a second host device that uses a second pinout that is different than the first pinout; and
interconnects electrically coupling the first contact pads of the first package-level substrate and the second contact pads of the printed circuit board,
wherein the printed circuit board and the interconnects are configured to provide the second host device access to the one or more semiconductor dies in the packaged semiconductor device through the first package-level substrate.

17. The semiconductor device assembly of claim 16, wherein the second contact pads include a different number of contact pads than the third contact pads.

18. The semiconductor device assembly of claim 16, wherein:
the first configuration comprises a universal flash storage 4.X configuration; and
the second configuration comprises a universal flash storage 3.X configuration.

19. The semiconductor device assembly of claim 16, wherein:
the first configuration comprises a universal flash storage 3.X configuration; and
the second configuration comprises a universal flash storage 4.X configuration.

20. The semiconductor device assembly of claim 16, wherein the packaged semiconductor device comprises a memory device carried by another printed circuit board including the first coupling surface.

* * * * *